United States Patent
Khlat et al.

(10) Patent No.: US 8,933,764 B2
(45) Date of Patent: Jan. 13, 2015

(54) TUNABLE DUPLEXER METHOD USING HYBRID TRANSFORMER WITH DUAL ANTENNA

(75) Inventors: Nadim Khlat, Cugnaux (FR); Marcus Granger-Jones, Scotts-Valley, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 301 days.

(21) Appl. No.: 13/435,393

(22) Filed: Mar. 30, 2012

(65) Prior Publication Data

US 2012/0256702 A1 Oct. 11, 2012

Related U.S. Application Data

(60) Provisional application No. 61/472,006, filed on Apr. 5, 2011.

(51) Int. Cl.
| | |
|---|---|
| H03H 7/38 | (2006.01) |
| H03H 7/09 | (2006.01) |
| H03H 7/48 | (2006.01) |
| H03H 7/46 | (2006.01) |
| H04B 1/00 | (2006.01) |
| H04B 1/52 | (2006.01) |

(52) U.S. Cl.
CPC . *H03H 7/48* (2013.01); *H03H 7/09* (2013.01); *H03H 7/463* (2013.01); *H04B 1/0064* (2013.01); *H04B 1/52* (2013.01); *H03H 7/38* (2013.01)
USPC .............................. 333/133; 333/132; 333/126

(58) Field of Classification Search
USPC ........................................ 333/132, 133, 126
See application file for complete search history.

(56) References Cited

U.S. PATENT DOCUMENTS

| | | | | |
|---|---|---|---|---|
| 5,533,011 | A * | 7/1996 | Dean et al. ..................... | 370/342 |
| 2007/0279150 | A1* | 12/2007 | Vangala et al. ............... | 333/134 |
| 2008/0212552 | A1* | 9/2008 | Fukamachi et al. .......... | 370/343 |
| 2009/0040131 | A1* | 2/2009 | Mosallaei ................. | 343/911 R |
| 2010/0134215 | A1* | 6/2010 | Lee et al. ...................... | 333/235 |
| 2011/0012696 | A1* | 1/2011 | Skarp ............................ | 333/195 |

OTHER PUBLICATIONS

Volakis, J. et al., "Antenna Engineering Handbook," Section 58-10, Figure 58.5, McGraw Hill, Jun. 2007, 1 page.
Mikhemar, M. et al., "A tunable integrated duplexer with 50dB isolation in 40nm CMOS," IEEE International Solid-State Circuits Conference, Feb. 2009, pp. 386-387A.

* cited by examiner

*Primary Examiner* — Stephen Jones
*Assistant Examiner* — Scott S Outten
(74) *Attorney, Agent, or Firm* — Withrow & Terranova, P.L.L.C.

(57) ABSTRACT

The present disclosure relates to a hybrid transformer duplexer apparatus. The hybrid transformer duplexer apparatus includes an autotransformer having a first port, a second port and a tap coupled to a first antenna port. A step-down transformer has a primary winding with a first terminal coupled to the first port of the autotransformer and a second terminal coupled to the second port of the autotransformer, and a secondary winding having a third terminal coupled to a second antenna port and a fourth terminal coupled to a common node.

29 Claims, 15 Drawing Sheets

TUNABLE DUPLEXER METHOD USING HYBRID TRANSFORMER WITH DUAL ANTENNA

RELATED APPLICATIONS

This application claims the benefit of provisional patent application Ser. No. 61/472,006, filed Apr. 5, 2011, the disclosure of which is hereby incorporated herein by reference in its entirety.

FIELD OF THE DISCLOSURE

The present disclosure generally relates to wireless communication systems and more particularly to a hybrid transformer duplexer apparatus.

BACKGROUND

Modern radio front-end architectures for third generation (3G) and fourth generation (4G) user equipment include a plurality of duplexers for each radio frequency (RF) band to be processed by a radio front-end architecture. As a proliferation of RF bands increase, a significant portion of a bill of materials (BOM) for a radio front-end also increases, which leads to additional financial costs and undesirable increases in circuit board area. FIG. 1 is a block diagram that shows a 3G radio front-end 10. As shown in the example of FIG. 1, it is not uncommon for a 3G front-end such as the 3G front-end 10 to need a first duplexer 12, a second duplexer 14 and a third duplexer 16 for three bands of operation. The first duplexer 12, the second duplexer 14, and the third duplexer 16 each feed a particular receive (RX) signal to a low noise amplifier (LNA) (not shown). Transmit (TX) power from a power amplifier (PA) (not shown) is selectively transferred through the first multiplexer 12, the second multiplexer 14, and the third duplexer 16 to an antenna 18 through a first single pole three throw (SP3T) switch 20 and a second SP3T switch 22. Even more troublesome than the BOM for 3G is the arrival of 4G in which up to eight duplexers may be needed.

At present, research efforts are underway to realize tunable duplexers using micro-electro-mechanical (MEMS) tunable resonators. One approach for realizing a tunable duplexer is based upon a hybrid transformer that is described in a related art paper entitled "A Tunable Integrated Duplexer with 50 dB Isolation in 40 nm CMOS" by M. Mikhemar, H. Darabi and A. Abidi from ISSCC2009.

FIG. 2 is a simplified schematic diagram of a related art hybrid transformer 24 described in the related art paper. The related art hybrid transformer 24 includes an autotransformer 26 having a transmit (TX) port 28 and a receive (RX) port 30 and an antenna port 32. The autotransformer 26 includes a first winding 34, a second winding 36, and a tap 38. This related art approach provides electrical isolation between the TX port 28 and the RX port 30 if the resistance value of a balanced resistor RBAL coupled between the TX port 28 and the RX port 30 is equal to four times a load resistance RL, where RL represents an antenna load resistor.

While the hybrid transformer 24 achieves its objective of tunability, it does so with a significant inefficiency by dissipating at last half of the energy passing through the TX port 28 and the RX port 30. The energy is dissipated by the RBAL resistor, which gives the hybrid transformer 24 an insertion loss of at least −3 dB with an assumption that the autotransformer 26 is ideal. Also troublesome is a need to dynamically tune RBAL relative to antenna voltage standing wave ratio (VSWR) changes which results dynamic changes in the value of RL. As such, a relatively expensive adaptive tuning circuit (not shown) is needed to tune RBAL to match the dynamic changes in the value of RL. What is needed is a hybrid transformer duplexer apparatus that does not create a −3 dB insertion loss by having balanced resistor RBAL.

SUMMARY

The present disclosure relates to a hybrid transformer duplexer apparatus. The hybrid transformer duplexer apparatus includes an autotransformer having a first port, a second port and a tap coupled to a first antenna port. A step-down transformer has a primary winding with a first terminal coupled to the first port of the autotransformer and a second terminal coupled to the second port of the autotransformer, and a secondary winding having a third terminal coupled to a second antenna port and a fourth terminal coupled to a common node.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 3:
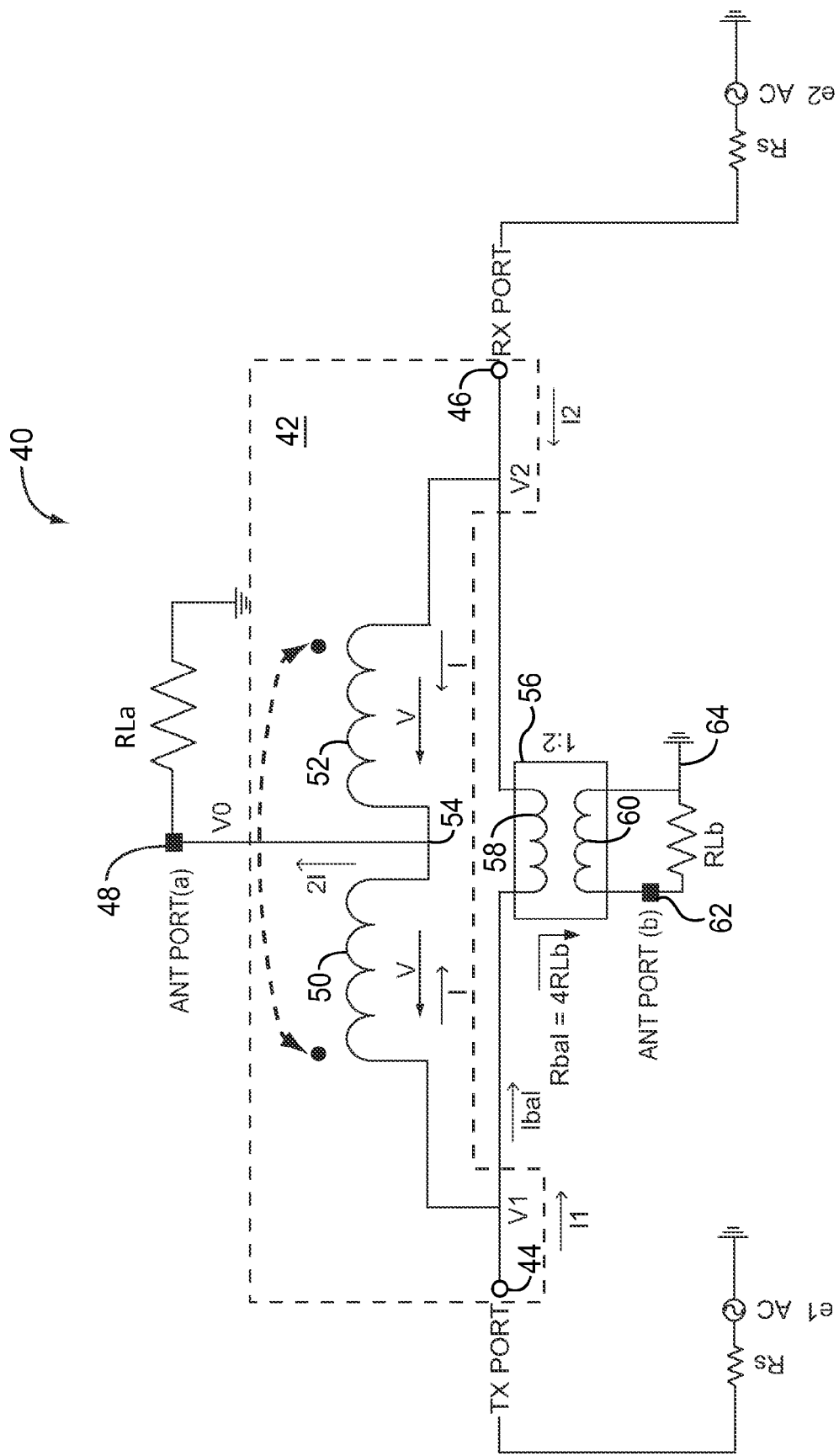
FIG. 3 is a schematic diagram of a hybrid transformer with dual antenna port balancing according to the present disclosure.

FIG. 3 is a schematic diagram of a hybrid transformer 40 with dual antenna port balancing according to the present disclosure. In particular, the hybrid transformer 40 includes an autotransformer 42 having a first port 44 and a second port 46 and an antenna port (a) 48. In the particular embodiment of FIG. 3, the first port 44 is a transmit (TX) port and the second port 46 is a receive (RX) port. The autotransformer 42 includes a first winding 50, a second winding 52, and a tap 54. The hybrid transformer 40 further includes a step-down transformer 56 having a primary winding 58 with a first terminal coupled to the first port 44 of the autotransformer 42 and a second terminal coupled to the second port 46 of the autotransformer 42, and a secondary winding 60 having a third terminal coupled to a second antenna port (b) 62 and a fourth terminal coupled to a common node 64

Figure 4:
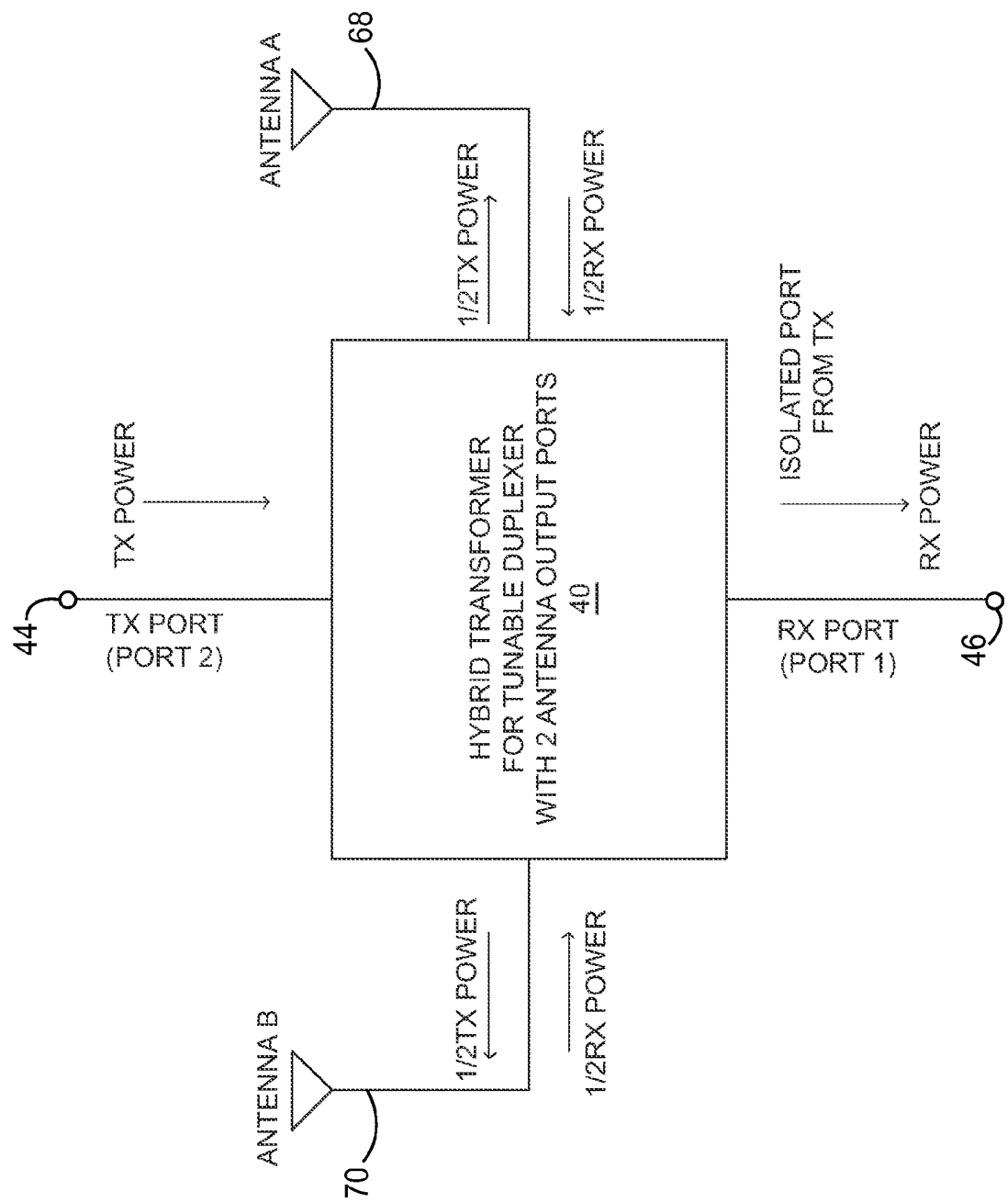
FIG. 4 is a block diagram of the hybrid transformer configured to realize a tunable duplexer arrangement that feeds dual antennas.

FIG. 4 is a block diagram of the hybrid transformer 40 configured to realize a tunable duplexer arrangement that feeds a first antenna 68 and a second antenna 70. In particular, transmit (TX) power is split with equal portions radiating from the first antenna 68 and the second antenna 70. Receive (RX) power captured by the first antenna 68 and the second antenna 70 is delivered to the second port 46. Isolation between the first port 44 functioning as a TX port and the second port 46 functioning as a receive port is achieved due to matching a voltage wave standing ratio (VSWR) of the first antenna 68 with a VSWR of the second antenna 70.

Even after achieving a relatively high isolation between the first port 44 and the second port 46, some RX filtering is needed to attenuate out-of-band blocker signals, which are typically as high as +0 dBm. Coexistence with wireless local area networks (WLANs) presents an even greater filtering challenge in that WLANs can present out-of-band blocker signals having a power level of on the order of +9 dBm at the first antenna 68 and the second antenna 70. Moreover, at least some transmitter filtering is needed to provide attenuation to meet out-of-band spectrum limits which are typically around −50 dBm/1 MHz and in some cases around −43 dBm/300 kHz due to nonlinearities in a transmit chain placed before the hybrid transformer 40. A bank of surface acoustical wave (SAW) filters can be employed to provide filtering of TX signals by about 5-10 dB, thus relaxing any isolation requirement for the hybrid transformer 40 by a same amount. In particular, the matching of the VSWRs between the first antenna 68 and the second antenna 70 can be relaxed by an equal amount. Note that the number of SAW filters needed is based only on out-of-band filtering requirements. As such, the number of resonators making up the bank of SAW filters is reduced since the SAW filters do not have to provide a relatively sharp roll-off for small duplex offsets.

Figure 5:
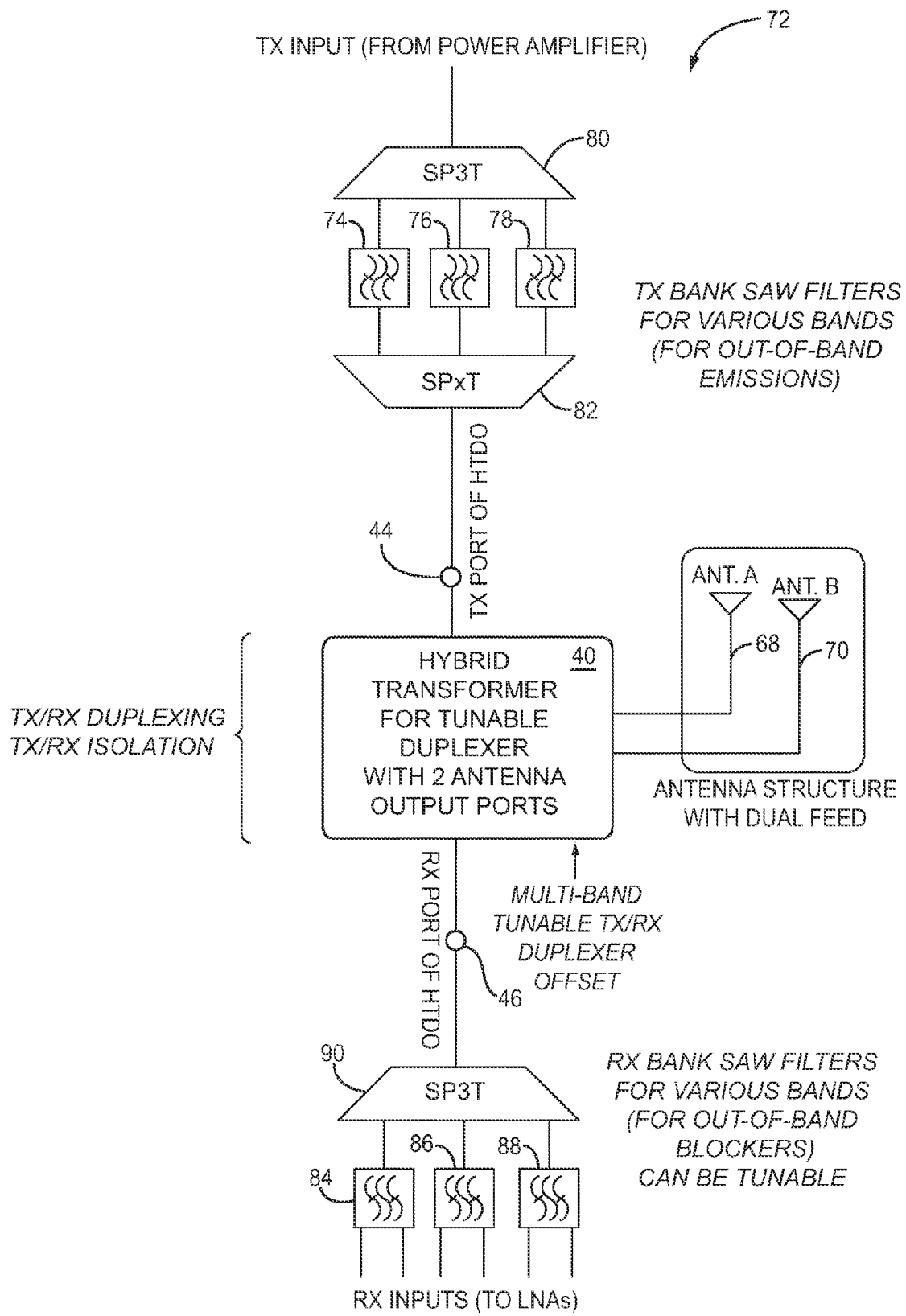
FIG. 5 is a block diagram of a front-end architecture that incorporates a plurality of surface acoustical wave (SAW) filters in combination with the disclosed hybrid transformer.

FIG. 5 is a block diagram of a front-end architecture 72 that incorporates a plurality of SAW filters in combination with the hybrid transformer 40. Transmit TX power from a power amplifier (PA) (not shown) is selectively transferred through a first SAW filter 74, a second SAW filter 76, and the third SAW filter 78 to first port 44 through a first single pole three throw (SP3T) switch 80 and a second SP3T switch 82. Receive (RX) power from low noise amplifiers (LNAs) (not shown) is selectively transferred to the second port 46 through a fourth SAW filter 84, a fifth SAW filter 86, and a sixth SAW filter 88 through a third SP3T switch 90.

Figure 6:
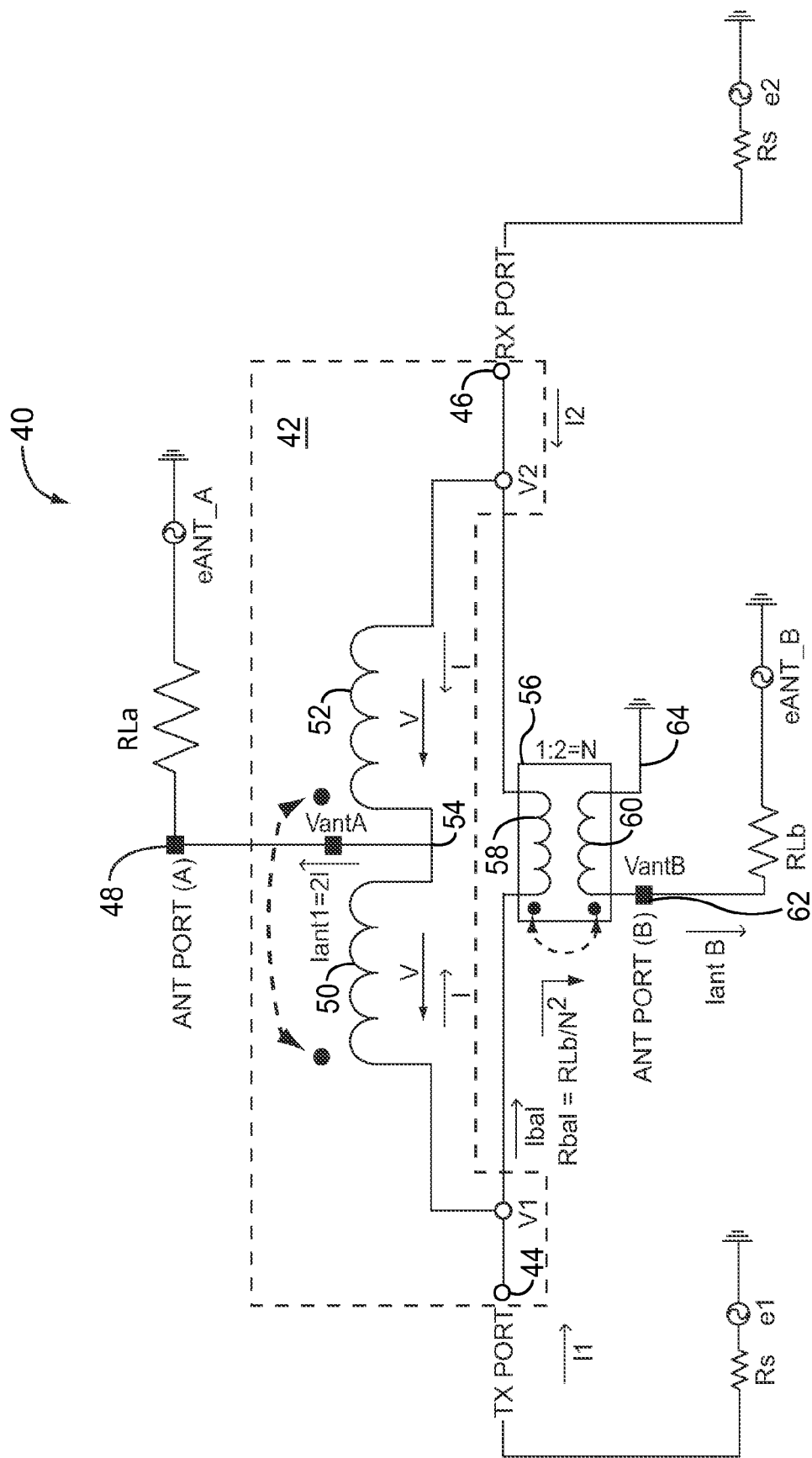
FIG. 6 is a block diagram of a simplified electrical model of the disclosed hybrid transformer under a dual antenna voltage standing wave ratio (VSWR) balancing condition.

FIG. 6 is a schematic of a simplified electrical model of the hybrid transformer 40 under a dual antenna VSWR balancing condition. Loading of the first antenna 68 is modeled with a load resister RLa that represents TX power radiated from the first antenna 68, whereas a voltage source eANT_A represents an RX signal captured by the first antenna 68. Similarly, loading of the second antenna 70 is modeled with a load resister RLb that represents TX power radiated from the second antenna 70. A voltage source eANT_B represents an RX signal captured by the second antenna 70. Current flowing into the first antenna 68 is represented by a current IantA, while current flowing into the second antenna 70 is represented by a current IantB. Electrical characteristics for the first port 44 are represented by a voltage source e1 and an output source resistance Rs, whereas electrical characteristics for the second port 46 are represented by a voltage source e2 and an equal output source resistance Rs. A node voltage with respect to the common node 64 for the first port 44 is represented by a voltage V1. Similarly, a node voltage with respect to the common node 64 for the second port 46 is represented by a voltage V2.

A current Ibal propagates through the primary winding 58 of the step-down transformer 56, which has a turns ratio of 1:2 to provide an impedance transformation ratio of 4:1 when looking into the primary winding 58 from the secondary winding 60. Equal currents I flow through the first winding 50 and the second winding 52. Moreover, equal voltages V are established across the first winding 50 and the second winding 52. An antenna voltage Vant A represents voltage developed on the first antenna 68, while an antenna voltage Vant B represents voltage developed on the second antenna 70.

$$V1 = e1/(1+Rs/(2\times RL)) + (eANT\_A + eANT\_B)/(1+2\times RL/Rs) \quad (eq.\ 1)$$

$$V2 = e2/(1+Rs/(2*RL)) + (eANT\_A - eANT\_B)/(1+2\times RL/Rs) \quad (eq.\ 2)$$

$$Vanta = (e1+e2)/2 \times 1/(1+Rs/(2\times RL)) + eanta \times Rs/(2\times RL)/(1+Rs/(2\times RL)) \quad (eq.\ 3)$$

$$Vantb = (e1-e2)/2 \times 1/(1+Rs/(2\times RL)) + eantb \times Rs/(2\times RL)/(1+Rs/(2\times RL)) \quad (eq.\ 4)$$

$$I = 1/(2\times RL+Rs) \times [(e1+e2)/2 - eANT\_A] \quad (eq.\ 5)$$

$$Ianta = 1/(RL+Rs/2) \times [(e1+e2)/2 - eANT\_A] \quad (eq.\ 6)$$

$$Iantb = 1/(RL+Rs/2) \times [(e1-e2)/2 - eANT\_B] \quad (eq.\ 7)$$

$$Ibal = 1/(2\times RL+Rs) \times [(e1-e2)/2 - eANT\_B] \quad (eq.\ 8)$$

$$I1 = 1/(2\times RL+Rs) \times [e1 - (eANT\_A + eANT\_B)] \quad (eq.\ 9)$$

$$I2 = 1/(2\times RL+Rs) \times [e2 - (eANT\_A - eANT\_B)] \quad (eq.\ 10)$$

Figure 7:
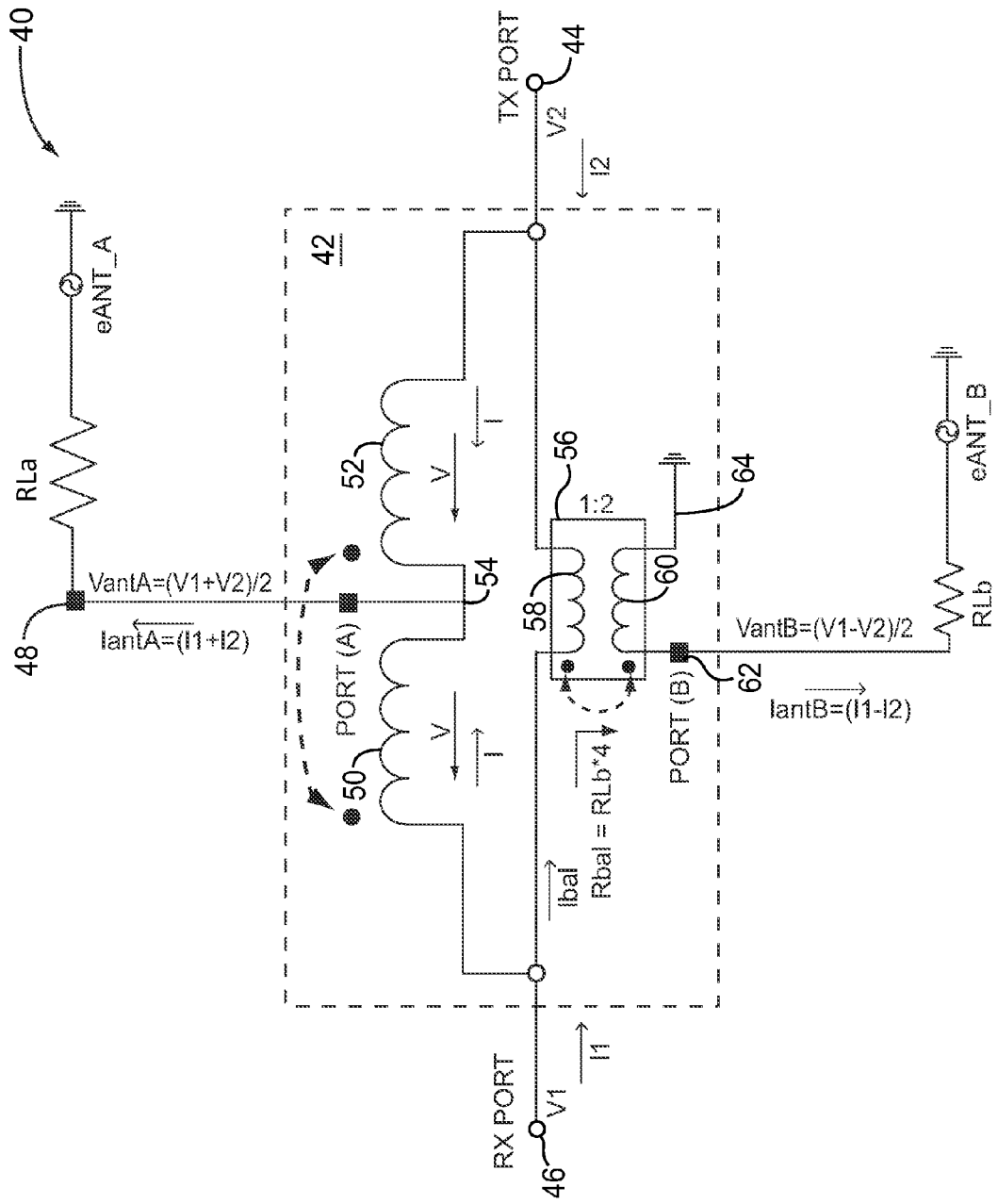
FIG. 7 is a schematic diagram of a hybrid transformer model for the hybrid transformer of FIG. 4 showing how equations of the dual antenna outputs are independent of antenna output loading.

FIG. 7 is a schematic diagram of a hybrid transformer model for the hybrid transformer 40 showing how equations of the dual antenna outputs are independent of antenna output loading. The following equations represent the operation of the hybrid transformer 40 independent of impedance matching for RLa and RLb.

$$Vanta=(V1+V2)/2$$

$$Ianta=(I1+I2)$$

$$Vantb=(V1-V2)/2$$

$$Iantb=(I1-I2)$$

The voltages V1 and V2 add at the antenna port (a) 48, while the voltages V1 and V2 subtract at the antenna port (b) 62. Moreover, the currents I1 and I2 add at the antenna port (a) 48, while the currents I1 and I2 subtract at the antenna port (b) 62. The following equations pertaining to power are produced by taking these voltage and current relationships into account.

$$Vanta \times IantA=(V1+V2)/2\times(I1+I2)=[V1\times I1/2+V2\times I2/2]+[V1\times I2/2+V2\times I1/2]$$

$$Vanta \times IantB=(V1-V2)/2\times(I1-I2)=[V1\times I1/2+V2\times I2/2]-[V1\times I2/2+V2\times I2/2]$$

Notice that the rightmost bracketed terms in the two power equations subtract to zero when the power at the antenna port (a) 48 is added to the power at antenna port (b) 62.

Figure 8:
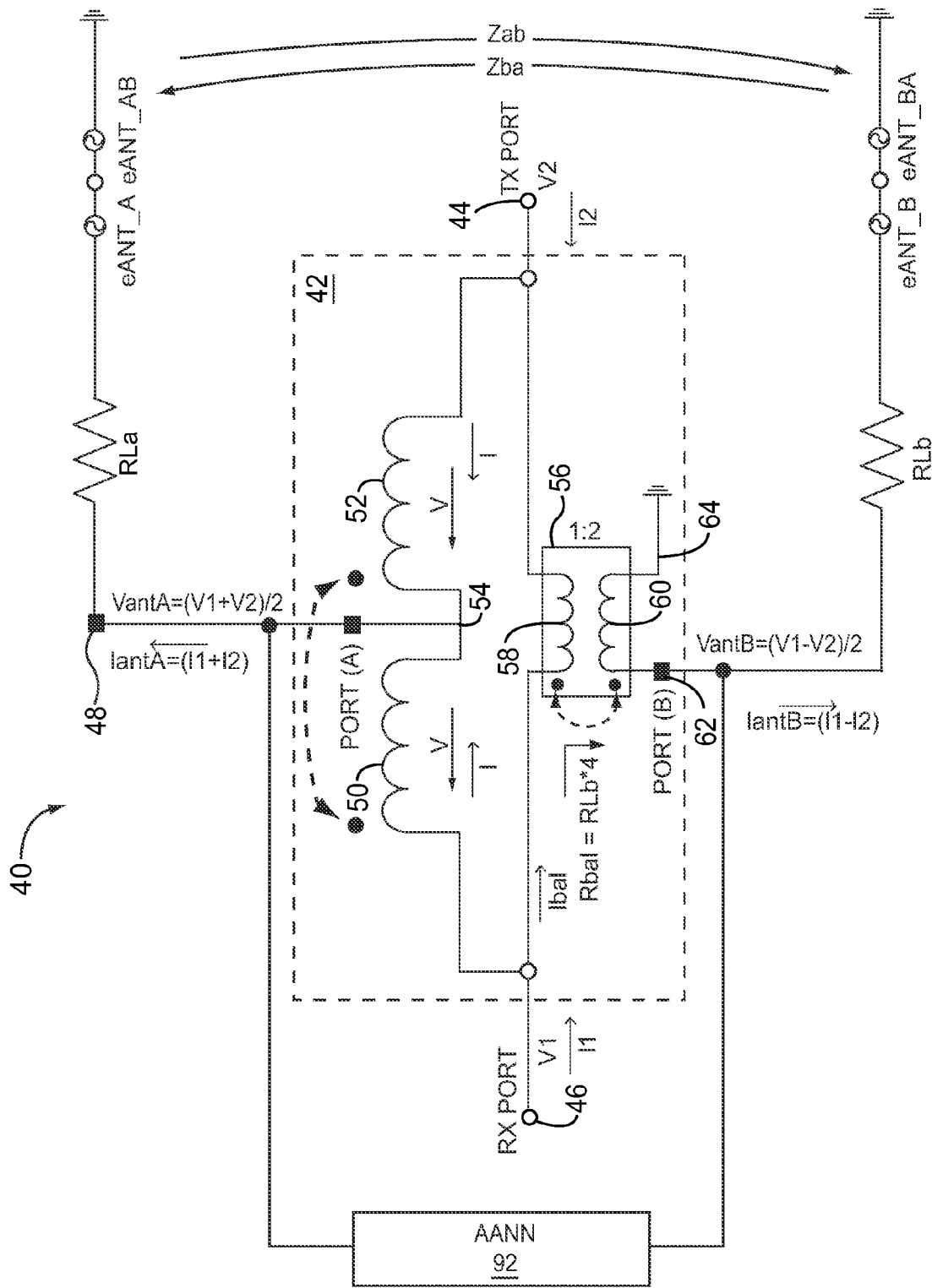
FIG. 8 is a schematic diagram of the hybrid transformer model that accounts for mutual coupling between two antennas.

FIG. 8 is a schematic diagram of the hybrid transformer model that accounts for mutual coupling between two antennas. In this case, the first antenna 68 (FIG. 4) and the second antenna 70 (FIG. 4) are not completely isolated from each other. The mutual coupling between the first antenna 68 and the second antenna 70 is modeled by an additional voltage source eANT_AB for the first antenna 68 and an additional voltage source eANT_BA for the second antenna 70. The additional voltage attributed to the voltage source eANT_AB is equal to a mutual coupling impedance Zab between the first antenna 68 and the second antenna 70 convolved with the current IantB. Similarly, the additional voltage attributed to the voltage source eANT_BA is equal to a mutual coupling impedance Zba between the second antenna 70 and the first antenna 68 convolved with the current IantA. The mutual impedances Zab and Zba are typically reactive coupling elements.

An adaptive antenna neutralization network (AANN) 92 may be coupled between the first antenna 68 and the second antenna 70 in order to minimize the impact of the mutual coupling. The AANN 92 typically comprises tunable reactive elements. As a result, the AANN 92 may be configured to provide an anti-resonance that reduces the mutual coupling between the first antenna 68 and the second antenna 70. In this way, any insertion loss created by the mutual coupling may be minimized.

Figure 9:
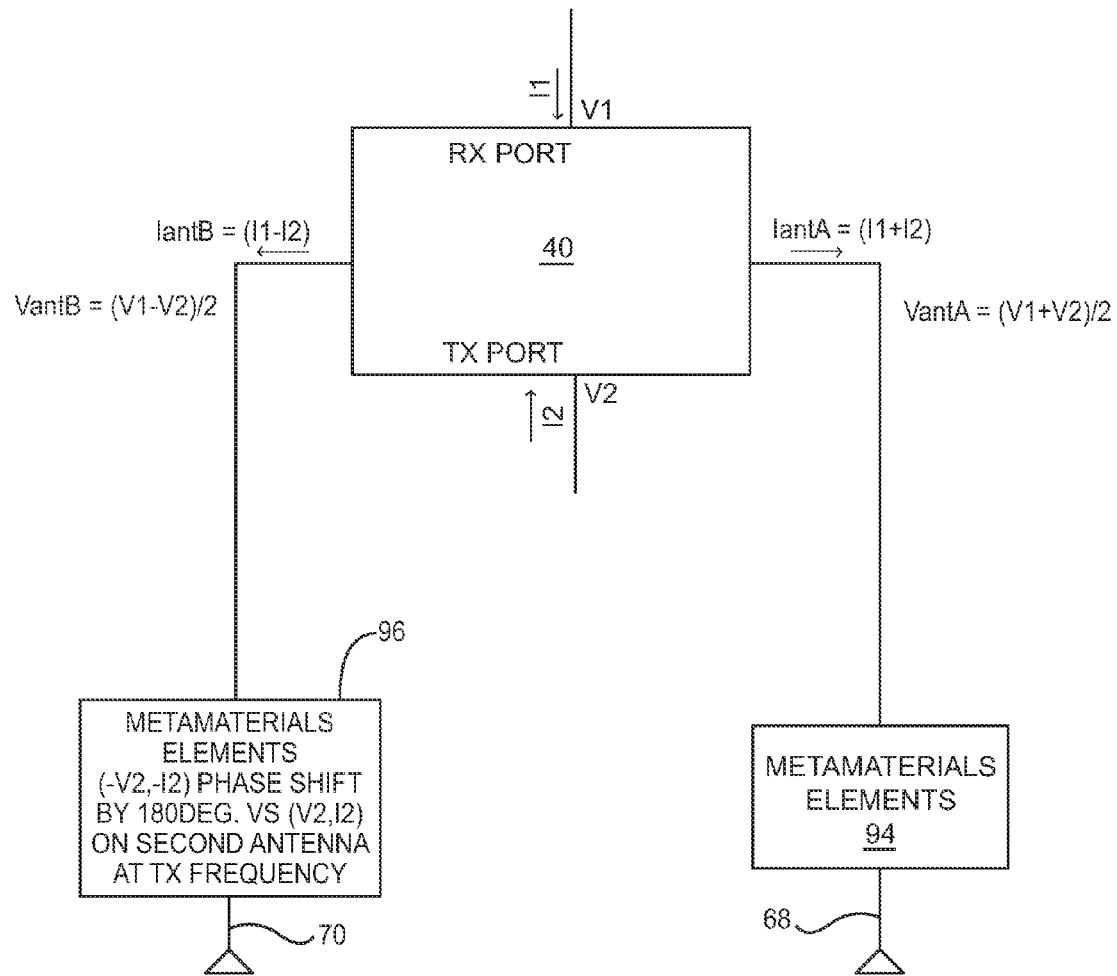
FIG. 9 is a block diagram of the disclosed hybrid transformer that includes metamaterial elements coupled to first and second antenna ports for providing negative inversion for voltage and current at a given transmit frequency.

FIG. 9 is a block diagram of the hybrid transformer 40 that includes metamaterial elements coupled to the first and second antenna ports for providing negative inversion for voltage and current at a given transmit frequency. In this regard, the hybrid transformer 40 includes a first group of metamaterial elements 94 coupled to the first antenna port (a) 48 and a second group of metamaterial elements 96 coupled to the second antenna port (b) 62 such that a negative inversion of antenna current and antenna voltage is generated relative to the first antenna port (a) 48 versus the second antenna port (b) 62 at a receive frequency. Moreover, the first group of metamaterial elements 94 and the second group of metamaterial elements 96 are configured such that a negative inversion of antenna current and antenna voltage is generated relative to the first antenna port (a) 48 versus the second antenna port (b) 62 at a receive frequency, while no phase inversion of antenna current and antenna voltage is generated relative to the first antenna port (a) 48 versus the second antenna port (b) 62 at a transmit frequency. In at least one embodiment, the first group of metamaterial elements 94 may comprise the first antenna 68 coupled to the first antenna port (a) 48 and the second group of metamaterial elements 96 may comprise the second antenna 70 coupled to the second antenna port (b) 62.

The first group of metamaterial elements 94 and the second group of metamaterial elements 96 have a negative permeability $\mu$ and a negative permittivity $\in$. Preferably, the first group of metamaterial elements 94 and the second group of metamaterial elements 96 are composite structures fabricated using conventional dielectric and conductive to produce the negative permeability $\mu$ and the negative permittivity $\in$ that allows radio frequency (RF) signals to propagate according to the left-hand rule of RF propagation, while RF power remains positive. Note that RF propagation according to the left-hand rule of propagation is not known to be possible using natural materials.

Filtering Requirements

Figure 10:
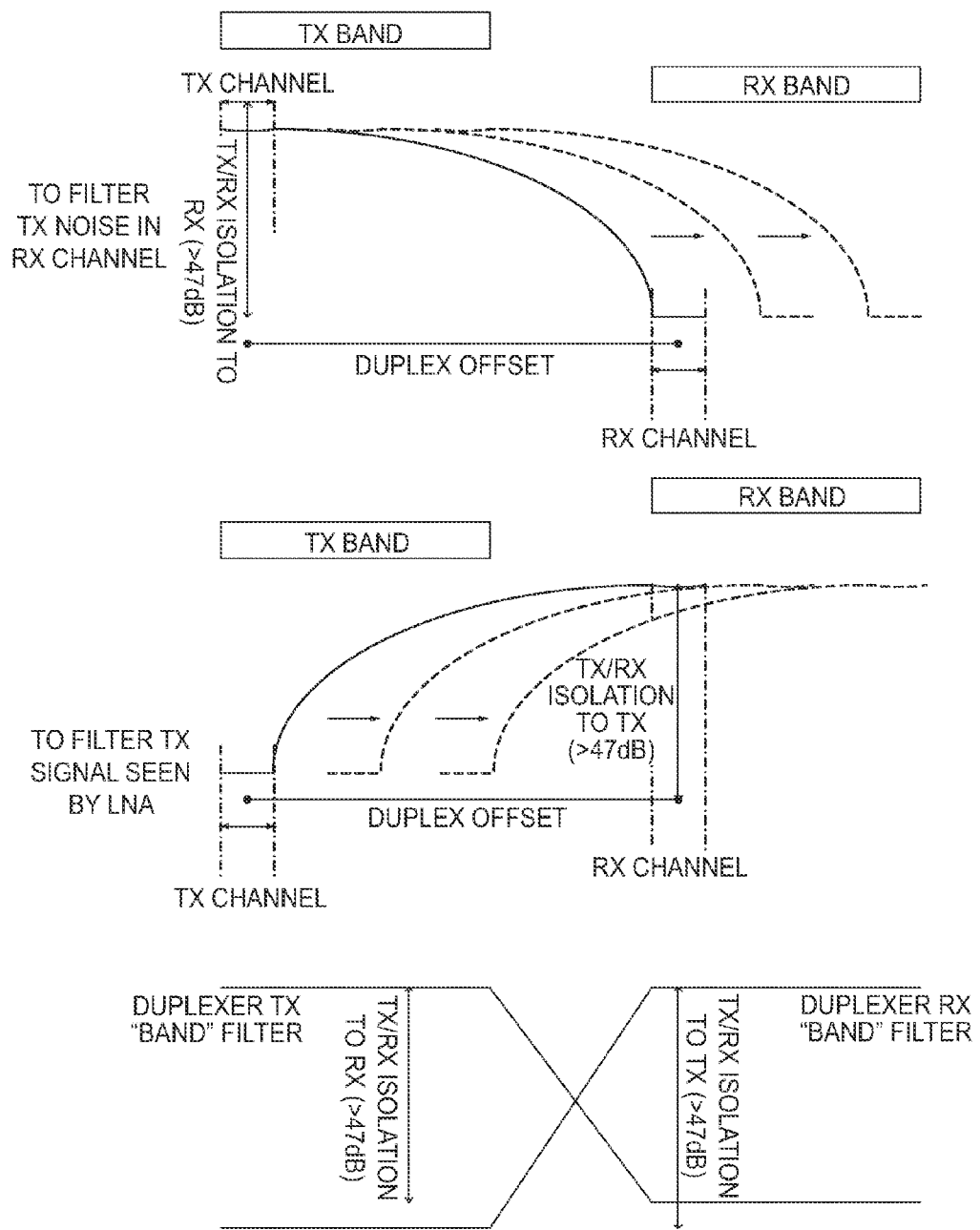
FIG. 10 is a spectrum diagram that represents related art duplexer TX and RX filter responses.

FIG. 10 is a spectrum diagram that represents related art duplexer TX and RX filter responses. The related art approach to filtering using duplexers based upon fixed transmit and receive filters are required to meet a minimum attenuation of a TX signal in an RX channel across a given RX band. There is also a requirement to meet a minimum attenuation of a TX signal at a receiver across a given TX band. As such, TX and RX filter specifications are driven by the TX to RX isolation requirements, which are relatively large at around 47 to 51 dB of minimum attenuation across the TX and RX bands filtered by duplexers.

Figure 11:
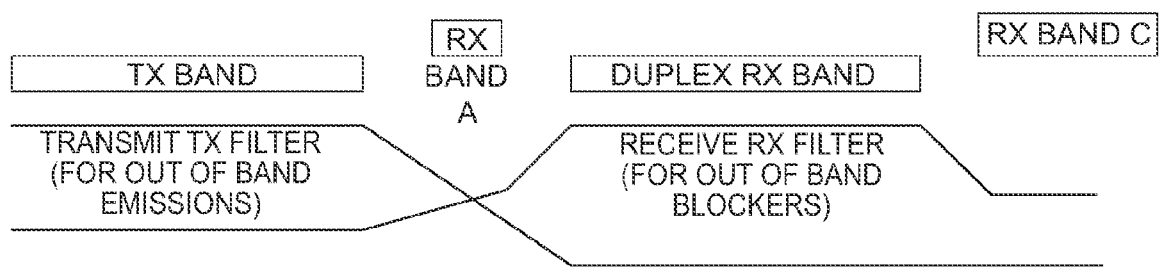
FIG. 11 is a spectrum diagram that represents the filter responses of TX and RX duplexers as configured in accordance with the present disclosure.

FIG. 11 is a spectrum diagram that represents the filter responses of TX and RX duplexers as configured in accordance with the present disclosure. In the present case, the requirement for TX and RX isolation is separate from out-of-band filtering requirements. Referring back to FIG. 5, a TX bank filter made up of the first SAW filter 74, the second SAW filter 76, and the third SAW filter 78 is usable as a programmable filter to provide filtering of transmit signals to meet emission requirements that limit emissions into RF bands that are dedicated to other users. It is desirable for a programmable RX bank filter made up of the fourth SAW filter 84, the fifth SAW filter 86, and the sixth SAW filter 88 to provide filtering of out-of-band blockers that are on the order of 50 dBm/1 MHz. A desirable range of attenuation for TX signal filtering is about 10-20 dB. A programmable filter for filtering received signals is also provided for filtering +0 dBm blockers by about −23 dB. A desirable range of RX signal filtering is about 10-20 dB. Thus, programmable filtering reduces the electrical isolation needed to be provided by the hybrid transformer 40 (FIG. 4) to about 28 dB-38 dB. The programmable filter can realized using micro-electro-mechanical systems (MEMS) resonators.

Hybrid Transformer Tuning Topologies

Figure 12:
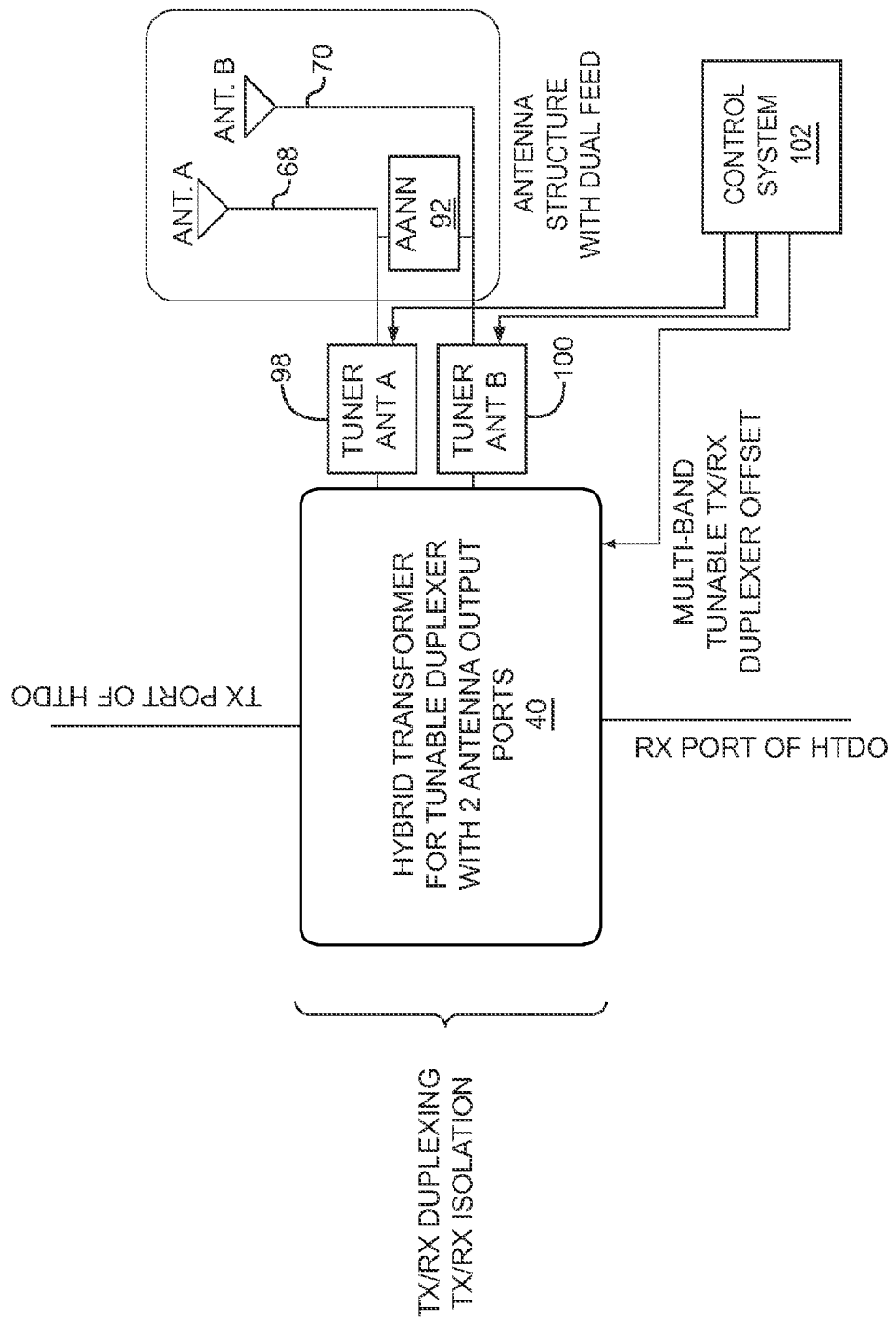
FIG. 12 is a block diagram of the hybrid transformer configured with a first antenna tuner, a second antenna tuner, and an adaptive antenna neutralization network (AANN).

FIG. 12 is a block diagram of the hybrid transformer 40 configured with a first antenna tuner 98, a second antenna tuner 100, and the AANN 92. The first antenna tuner 98 and the second antenna tuner 100 may be made up of programmable reactive elements arrays comprised of inductors and capacitors. Moreover, a control system 102 allows dynamic tuning of the first antenna tuner 98 and the second antenna tuner 100. In this manner, a relative impedance match between the first antenna 68 and the second antenna 70 may be maintained during antenna VSWR changes. Moreover, the AANN 92 coupled in parallel between the first antenna tuner 98 and the second antenna 70 provides improved impedance matching. Further still, a multi-band tunable TX/RX duplexer offset signal may be provided by the control system 102.

Figure 13:
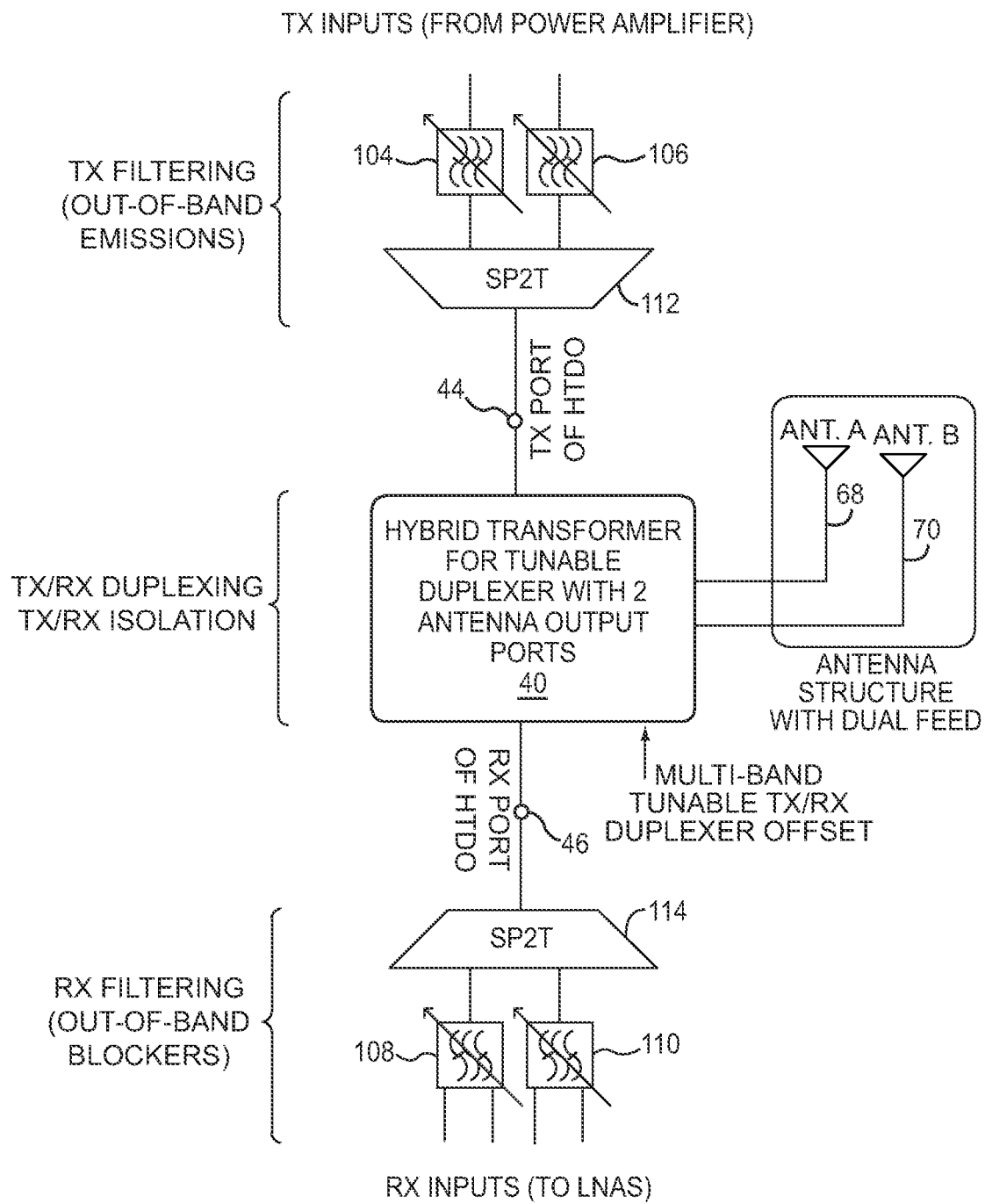
FIG. 13 is a block diagram of the disclosed hybrid transformer configured as a tunable duplexer with high band and low band tunable filters.

FIG. 13 is a block diagram of the hybrid transformer 40 configured as a tunable duplexer with a first high band tunable filter 104, a second high band tunable filter 106, a first low band tunable filter 108, and a second low band tunable filter 110. The first high band tunable filter 104 and the second high band tunable filter 106 are selectively coupled to the first port 44 of the hybrid transformer 40 through a first SP2T switch 112. A second SP2T switch 114 selectively couples the first low band tunable filter 108 and the second low band tunable filter 110 the second port 46 of the hybrid transformer 40.

The first high band tunable filter 104 and the second high band tunable filter 106 are configured for out-of-band emissions attenuation that is on the order of 20-30 dB. The first low band tunable filter 108 and the second low band tunable filter 110 are configured to attenuate out-of-band blockers by about 20-30 dB. The first high band tunable filter 104, the second high band tunable filter 106, the first low band tunable filter 108, and the second low band tunable filter 110 may be realized using silicon-on-insulator (SOI) technology or MEMS technology or a combination thereof.

Figure 14:
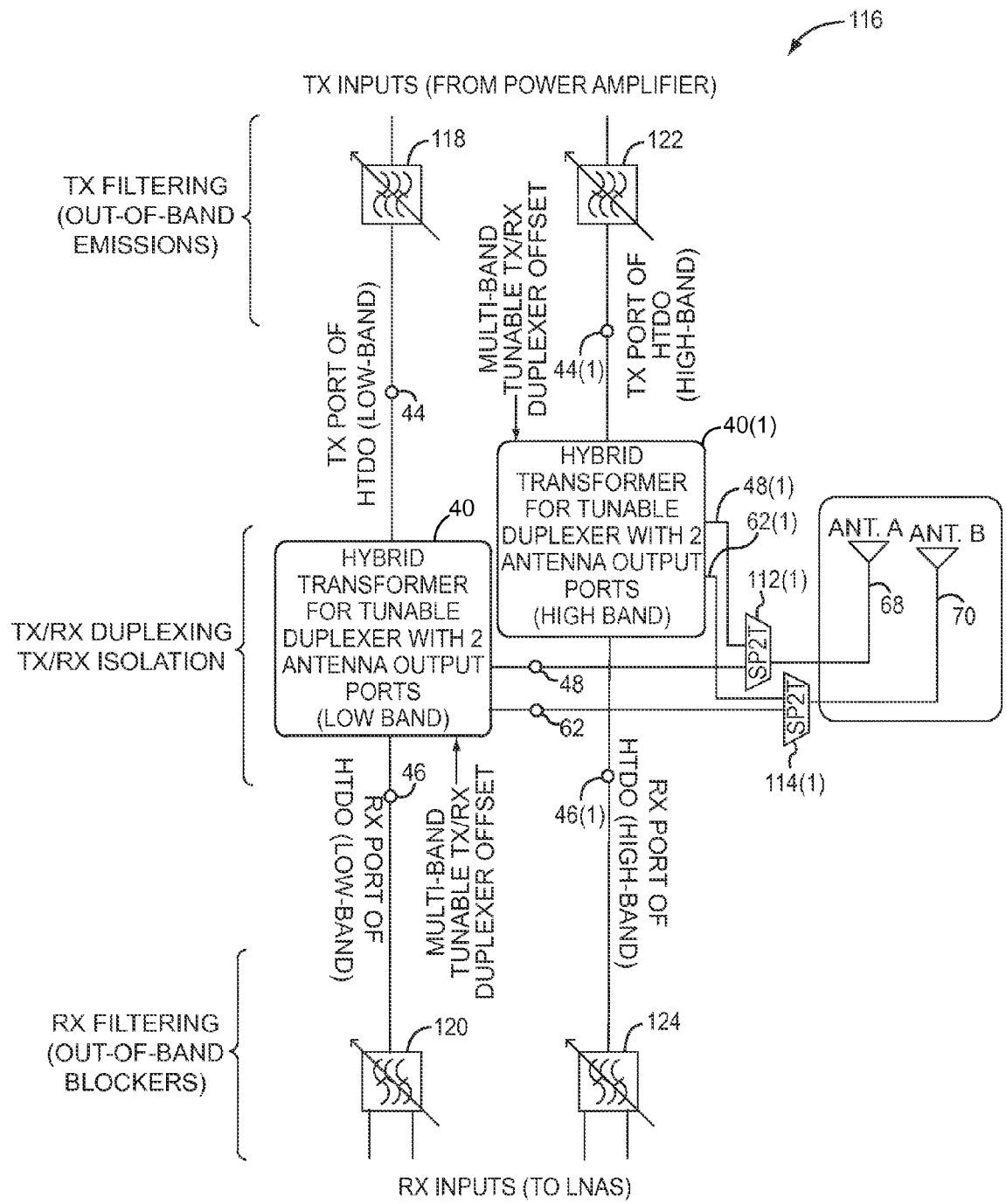
FIG. 14 is a block diagram of a high band hybrid transformer combined with a low band hybrid transformer that are configured as a tunable duplexer having high band and low band tunable filters.

FIG. 14 is a block diagram of the hybrid transformer 40 configured for high band operation combined with a second hybrid transformer 40(1) configured for low band operation. A tunable duplexer 116 having a tunable low band TX filter 118, a tunable low band RX filter 120, a tunable high band TX filter 122, and a tunable high band RX filter 124 is realized by employing both the hybrid transformer 40 and the second hybrid transformer 40(1). The tunable low band TX filter 118 is coupled to the first port 44, while the tunable low band RX filter 120 is coupled to the second port 46. Similarly, the tunable high band TX filter 122 is coupled to the first port 44(1) of the second hybrid transformer 40(1), while the tunable high band RX filter 124 is coupled to the second port 46(1) of the hybrid transformer 40(1).

The first antenna 68 is selectively coupled to the antenna port (a) 48 of the hybrid transformer 40 or to an antenna port 48(1) of the second hybrid transformer 40(1) through a first SP2T switch 112(1). The second antenna 70 is selectively coupled to the antenna port(b) 62 of the hybrid transformer 40 or to an antenna port 62(1) of the second hybrid transformer 40(1) through a second SP2T switch 114(1).

TX Combiner Application

Figure 15:
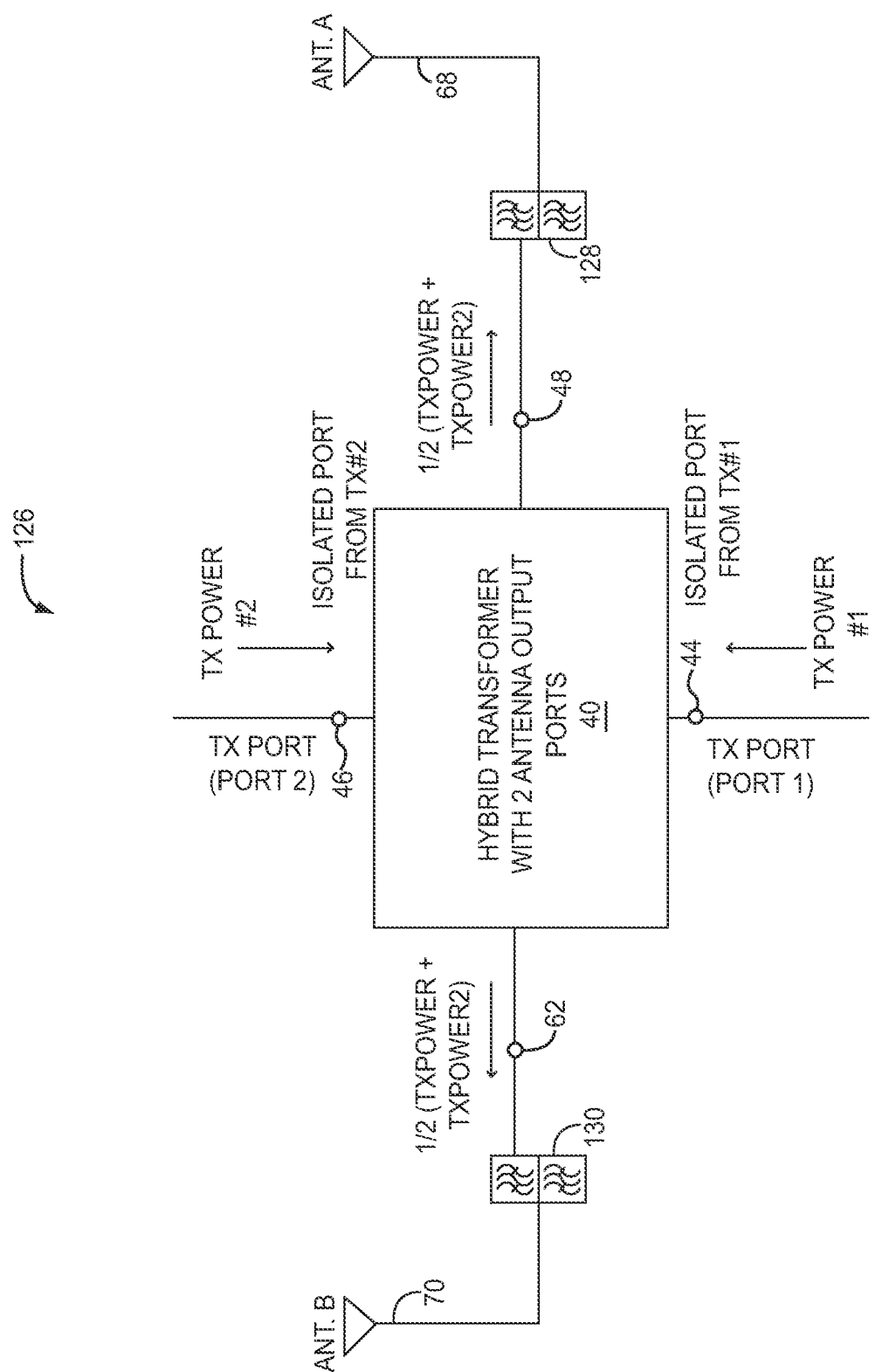
FIG. 15 is a block diagram of an efficient TX combiner for combining two TX carriers.

FIG. 15 is a block diagram of an efficient TX combiner 126 for combining two TX carriers. The TX combiner 126 includes the hybrid transformer 40 with a first TX filter 128 coupled between the first antenna port (a) 48 and the first antenna 68. Also included is a second TX filter 130 that is coupled between second antenna port 62 and the second antenna 70.

Figure 1:
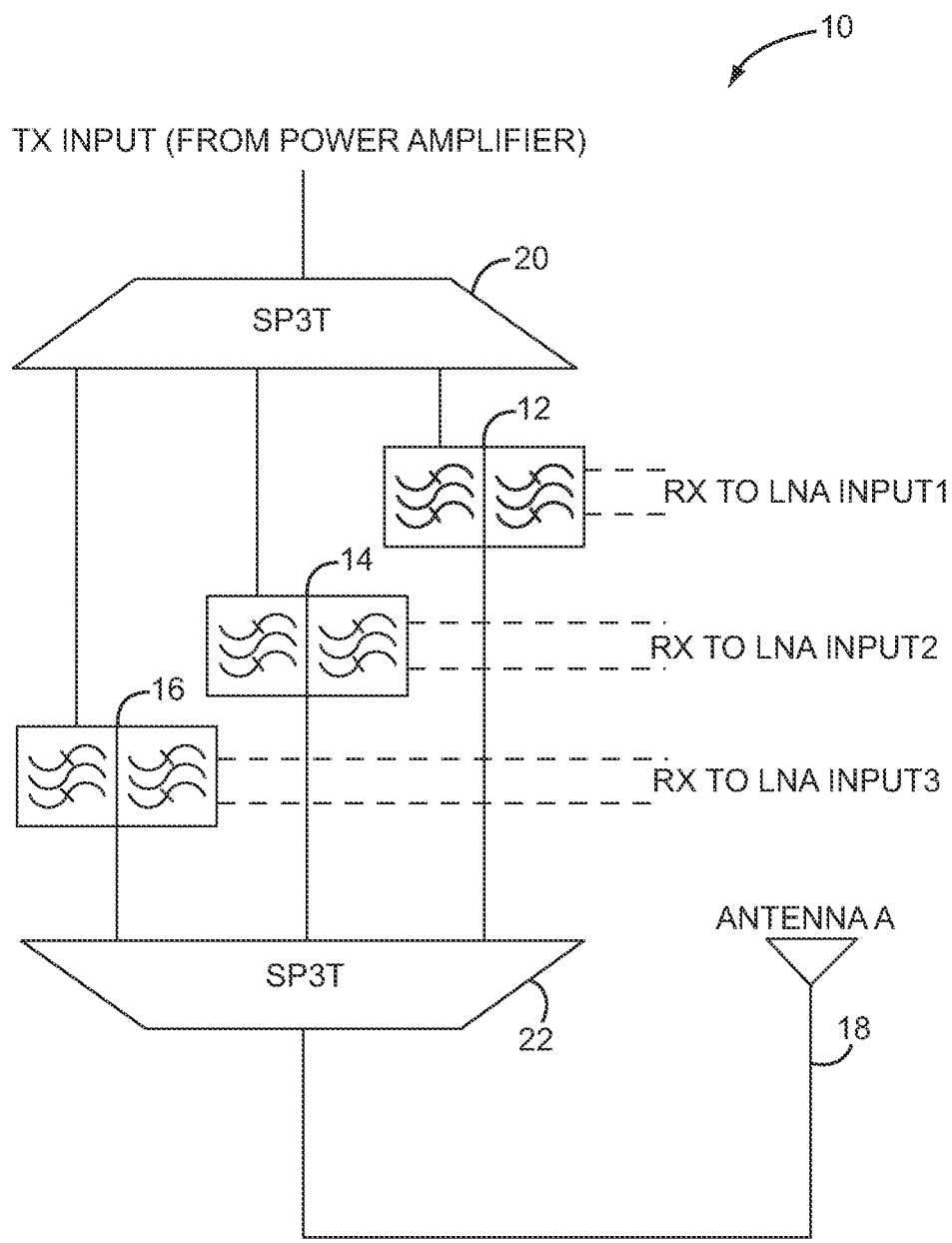
FIG. 1 is a simplified block diagram that shows a 3G radio front-end.
Figure 2:
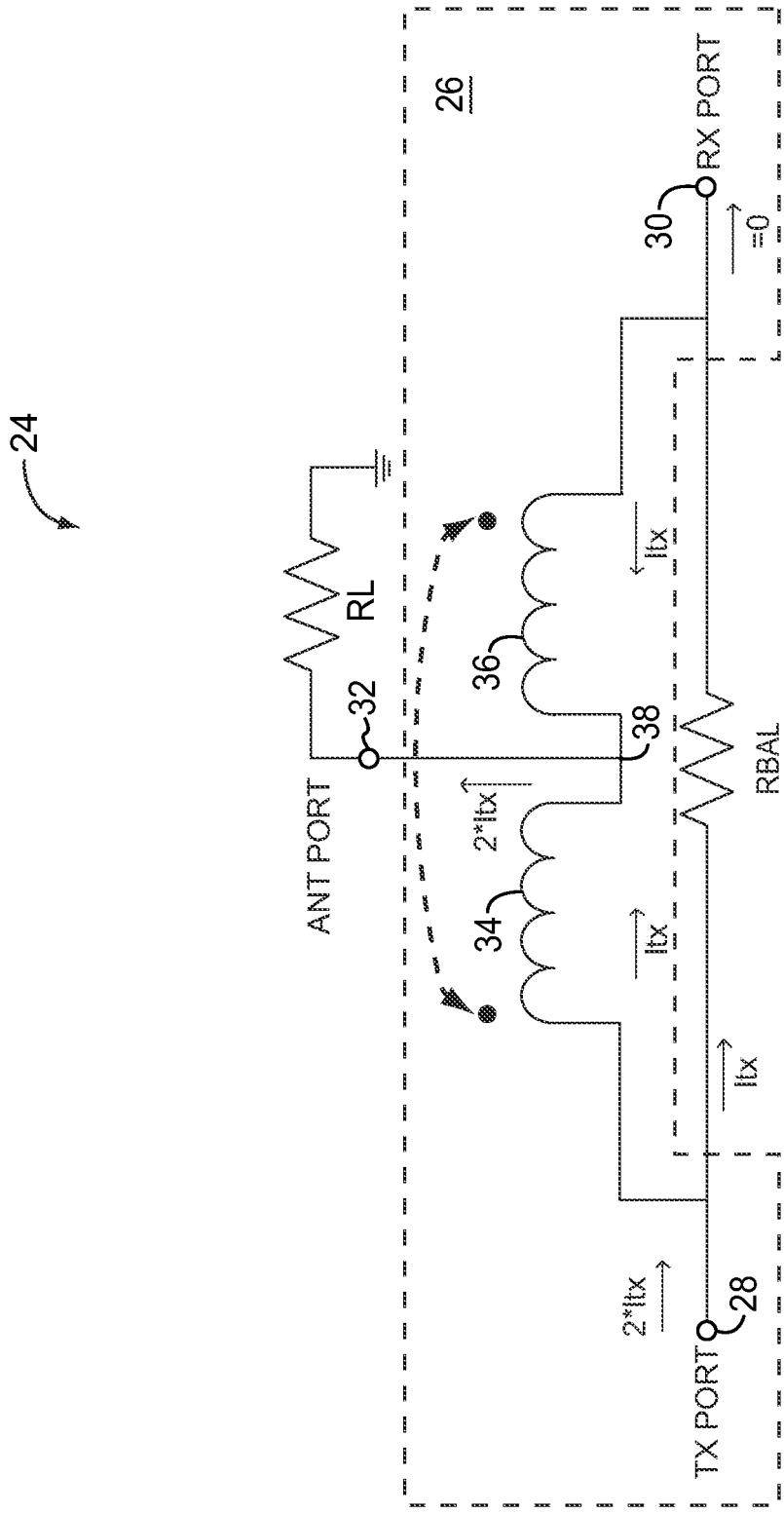
FIG. 2 is a schematic diagram of a related art hybrid transformer.

The TX combiner 126 is particularly well suited for long term evolution advanced (LTE-Advanced) applications wherein a transmitter (not shown) would transmit two carriers instead of a single carrier. Moreover, the two carriers may be contiguous or non-contiguous. In particular, the TX combiner 126 allows the use of two separate power amplifiers (PAs) with each PA being dedicated to amplifying one of the two carriers. One amplified carrier is transmittable through the first antenna port (a) 48 while the other carrier is transmitted through the second antenna port (b) 62. In another option, the amplified carriers are combined so that they are transmittable from both the first antenna 68 and the second antenna 70 simultaneously. A none limiting benefit of the TX combiner 126 is that two carriers may be transmitted without sacrificing 3 dB loss that typically occurs using related art hybrid transformers such as the related art hybrid transformer 24 (FIG. 2).

Those skilled in the art will recognize improvements and modifications to the preferred embodiments of the present disclosure. All such improvements and modifications are considered within the scope of the concepts disclosed herein and the claims that follow.

What is claimed is:

1. A hybrid transformer duplexer apparatus comprising:
an autotransformer having a first port, a second port and a tap coupled to a first antenna port; and
a step-down transformer having a primary winding with a first terminal coupled to the first port of the autotransformer and a second terminal coupled to the second port of the autotransformer, and a secondary winding having a third terminal coupled to a second antenna port and a fourth terminal coupled to a common node.

2. The hybrid transformer duplexer apparatus of claim 1 wherein the first port is a transmit (TX) port and the second port is a receive (RX) port.

3. The hybrid transformer duplexer apparatus of claim 2 further including a TX bank of surface acoustical wave (SAW) filters coupled to the first port.

4. The hybrid transformer duplexer apparatus of claim 3 wherein the TX bank of SAW filters are tuned to attenuate out of band emissions.

5. The hybrid transformer duplexer apparatus of claim 2 further including an RX bank of SAW filters coupled to the second port.

6. The hybrid transformer duplexer apparatus of claim 5 wherein the RX band of SAW filters are tuned to attenuate out of band interferers and blockers.

7. The hybrid transformer duplexer apparatus of claim 2 further including a tunable TX filter coupled to the first port.

8. The hybrid transformer duplexer apparatus of claim 7 wherein the tunable TX filter is configured to attenuate out-of-band emissions.

9. The hybrid transformer duplexer apparatus of claim 7 wherein the tunable TX filter comprises a digitally controllable micro-electro-mechanical systems (MEMS) resonator.

10. The hybrid transformer duplexer apparatus of claim 2 further including a tunable RX filter coupled to the second port.

11. The hybrid transformer duplexer apparatus of claim 10 wherein the tunable RX filter is configured to attenuate blocker signals.

12. The hybrid transformer duplexer apparatus of claim 10 wherein the tunable RX filter comprises a digitally controllable MEMS resonator.

13. The hybrid transformer duplexer apparatus of claim 2 further including a low-band tunable TX filter and a high band tunable TX filter, both of which are selectively coupled to the first port.

14. The hybrid transformer duplexer apparatus of claim 2 further including a low-band tunable RX filter and a high band tunable RX filter, both of which are selectively coupled to the second port.

15. The hybrid transformer duplexer apparatus of claim 1 wherein the first port is a TX port and the second port is a TX port.

16. The hybrid transformer duplexer apparatus of claim 15 further including a first duplexer coupled to the first antenna port and a second duplexer coupled to the second antenna port.

17. The hybrid transformer duplexer apparatus of claim 1 further including a first group of metamaterial elements coupled to the first antenna port and a second group of metamaterial elements coupled to the second antenna port such that a negative inversion of antenna current and antenna voltage is generated relative to the first antenna port versus the second antenna port at a receive frequency.

18. The hybrid transformer duplexer apparatus of claim 17 wherein the first group of metamaterial elements comprises a first antenna coupled to the first antenna port and the second group of metamaterial elements comprises a second antenna coupled to the second antenna port.

19. The hybrid transformer duplexer apparatus of claim 1 further including a first group of phase shifter elements coupled to the first antenna port and a second group of phase shifter elements coupled to the second antenna port such that a negative inversion of antenna current and antenna voltage is generated relative to the first antenna port versus the second antenna port at a receive frequency, while no phase inversion of antenna current and antenna voltage is generated relative to the first antenna port versus the second antenna port at a transmit frequency.

20. The hybrid transformer duplexer apparatus of claim 1 further including an RX/TX antenna tuner coupled to the first antenna port.

21. The hybrid transformer duplexer apparatus of claim 1 further including an RX/TX antenna tuner coupled to the second antenna port.

22. The hybrid transformer duplexer apparatus of claim 1 further including an adaptive antenna neutralization network communicatively coupled between the first antenna port and the second antenna port.

23. A dual hybrid transformer duplexer apparatus comprising:
a first autotransformer having a first TX port, a first RX port and a first tap coupled to a first high band antenna port;
a first step-down transformer having a first primary winding with a first primary terminal coupled to the first TX port of the first autotransformer and a second primary terminal coupled to the first RX port of the first autotransformer, and a first secondary winding having a first secondary terminal coupled to a second high band antenna port and a second secondary terminal coupled to a common node; and
a second autotransformer having a second TX port, a second RX port and a second tap coupled to a first low band antenna port;
a second step-down transformer having a second primary winding with a third primary terminal coupled to the second TX port of the second autotransformer and a fourth primary terminal coupled to the second RX port of the second autotransformer, and a second secondary winding having a third secondary terminal coupled to a second low band antenna port and a fourth secondary terminal coupled to the common node.

24. The dual hybrid transformer duplexer apparatus of claim 23 further including a high band tunable TX filter coupled to the first TX port.

25. The dual hybrid transformer duplexer apparatus of claim 23 further including a low band tunable TX filter coupled to the second TX port.

26. The dual hybrid transformer duplexer apparatus of claim 23 further including a bank of tunable high band RX filters coupled to the first RX port.

27. The dual hybrid transformer duplexer apparatus of claim 23 further including a bank of tunable low band RX filters coupled to the second RX port.

28. The dual hybrid transformer duplexer apparatus of claim 23 further including a single pole double throw (SP2T) high band switch having a first antenna output, a first input coupled to the first high band antenna port and a second input coupled to the first low band antenna port.

29. The dual hybrid transformer duplexer apparatus of claim 23 further including a SP2T low band switch having a second antenna output, a third input coupled to the second high band antenna port, and a fourth input coupled to the second low band antenna port.

* * * * *